(12) United States Patent
Suzuki et al.

(10) Patent No.: US 7,749,617 B2
(45) Date of Patent: Jul. 6, 2010

(54) ORGANIC COMPOUND AND ORGANIC LIGHT-EMITTING DEVICE

(75) Inventors: Koichi Suzuki, Yokohama (JP); Kazunori Ueno, Ebina (JP); Akira Tsuboyama, Machida (JP); Seiichi Yogi, Naha (JP)

(73) Assignee: Canon Kabushiki Kaisha, Tokyo (JP)

( * ) Notice: Subject to any disclaimer, the term of this patent is extended or adjusted under 35 U.S.C. 154(b) by 442 days.

(21) Appl. No.: 11/217,614

(22) Filed: Sep. 2, 2005

(65) Prior Publication Data
US 2006/0051616 A1 Mar. 9, 2006

(30) Foreign Application Priority Data
Sep. 8, 2004 (JP) .............................. 2004-260436

(51) Int. Cl.
*H01L 51/54* (2006.01)
*C09K 11/06* (2006.01)

(52) U.S. Cl. .................. 428/690; 428/917; 252/301.23; 257/40; 257/E51.05; 544/180

(58) Field of Classification Search ................ 544/224, 544/238–241, 252.01, 252.05–252.06, 180–220; 428/690, 917; 427/58, 66; 313/502–509; 257/40, 88–103, E51.001–E51.052; 252/301.16–301.35
See application file for complete search history.

(56) References Cited

U.S. PATENT DOCUMENTS

| | | | |
|---|---|---|---|
| 4,220,765 A * | 9/1980 | Findeisen | 544/179 |
| 4,539,507 A | 9/1985 | VanSlyke et al. | 313/504 |
| 4,720,432 A | 1/1988 | VanSlyke et al. | 428/457 |
| 4,885,211 A | 12/1989 | Tang et al. | 428/457 |
| 4,992,204 A * | 2/1991 | Kluger et al. | 252/301.16 |
| 5,130,603 A | 7/1992 | Tokailin et al. | 313/504 |
| 5,151,629 A | 9/1992 | VanSlyke | 313/504 |
| 5,227,252 A | 7/1993 | Murayama et al. | 428/690 |
| 5,247,190 A | 9/1993 | Friend et al. | 257/40 |
| 5,317,169 A | 5/1994 | Nakano et al. | 257/40 |
| 5,382,477 A | 1/1995 | Saito et al. | 428/690 |
| 5,409,783 A | 4/1995 | Tang et al. | 428/690 |
| 5,514,878 A | 5/1996 | Holmes et al. | 257/40 |
| 5,672,678 A | 9/1997 | Holmes et al. | 528/373 |
| 5,726,457 A | 3/1998 | Nakano et al. | 257/40 |
| 6,093,864 A | 7/2000 | Tokailin et al. | 585/125 |
| 6,303,238 B1 | 10/2001 | Thompson et al. | 428/690 |
| 6,579,632 B2 | 6/2003 | Thompson et al. | 428/690 |
| 2003/0214228 A1 * | 11/2003 | Itou | 313/504 |

FOREIGN PATENT DOCUMENTS

| | | |
|---|---|---|
| JP | 2-247278 | 10/1990 |
| JP | 3-255190 | 11/1991 |
| JP | 4-145192 | 5/1992 |
| JP | 5-202356 | 8/1993 |
| JP | 9-202878 | 8/1997 |
| JP | 9-227576 | 9/1997 |
| JP | 2003-335754 A * | 11/2003 |
| JP | 2004256454 * | 9/2004 |

OTHER PUBLICATIONS

Inomata et al., "High-Efficiency Organic Electrophosphorescent Diodes Using 1,3,5-Triazine Electron Transport Materials," Chemistry of Materials, vol. 16, No. 7, pp. 1285-1291, Apr. 2004.*
Lee et al., "Competition between the formation of excimers and excitons during the photoluminescence of light-emitting polymer blends," Journal of Polymer Science Part A: Polymer Chemistry, vol. 42, No. 3, pp. 557-565, Feb. 2004.*
Machine translation of JP 2003-335754 A.*
Yamamoto, et al.; "A Novel Type of Condensation . . . C-C Coupling"; Bull. Chem. Soc. JPN.; vol. 51, No. 7, 2091-2097 (1978).
Tang, et al.; "Organic electroluminescent diodes"; Appl. Phys. Lett., vol. 51, No. 12, 913-915 (1987).
Burroughes, et al.; "Light-emitting diodes .. polymers"; Nature, vol. 347, 539-541 (1990).
Miyaura, et al.; "Palladium-Catalyzed . . . Organoboron Compounds"; Chem. Rev., vol. 95, No. 7, 2456-2483 (1995).
Baldo, et al.; "Highly efficient phosphorescent . . . electroluminescent devices"; Nature, vol. 395, 151-153 (1998).

* cited by examiner

*Primary Examiner*—D. Lawrence Tarazano
*Assistant Examiner*—Michael Wilson
(74) *Attorney, Agent, or Firm*—Fitzpatrick, Cella, Harper & Scinto (57) ABSTRACT

The present invention provides a novel organic compound capable of simultaneously emitting fluorescence and phosphorescence. The organic compound according to the present invention is an organic compound consisting of only elemental hydrogen and at least two kinds of elements selected from the group consisting of elements belonging to the thirteenth group to the seventeenth group of the second period to the fifth period of the periodic table, and being capable of simultaneously emitting fluorescence and phosphorescence at a temperature of from −30° C. or more and 100° C. or less.

1 Claim, 4 Drawing Sheets

ORGANIC COMPOUND AND ORGANIC LIGHT-EMITTING DEVICE

BACKGROUND OF THE INVENTION

1. Field of the Invention

The present invention relates to a novel organic compound and an organic light-emitting device employing the same.

2. Related Background Art

An organic light-emitting device is a device in which a thin film containing a fluorescent organic compound or a phosphorescent organic compound is sandwiched between an anode and a cathode, wherein an exciton is generated from the fluorescent compound or phosphorescent compound by injection of electrons and holes from each electrode, and light is radiated from the exciton when the exciton returns to a ground state, whereby the light is utilized as the light to be emitted from the device.

A study conducted by Eastman Kodak Company in 1987 (Appl. Phys. Lett. 51, 913 (1987)) reported light emission in the order of 1,000 cd/m$^2$ at an applied voltage of about 10 V, from a separated-function type device having two-layer structure in which an anode is made of ITO and a cathode is made of magnesium-silver alloy, an aluminum quinolinol complex is used as both of an electron-transporting material and a light-emitting material and also a triphenylamine derivative is used as a hole-transporting material. Related patents include U.S. Pat. Nos. 4,539,507, 4,720,432, and 4,885,211.

In addition, light emission at spectra ranging from ultraviolet through infrared is allowed by changing the kind of the fluorescent organic compound. Recently, therefore, various compounds have been studied extensively and described in, for example, U.S. Pat. Nos. 5,151,629, 5,409,783 and 5,382,477, and Japanese Patent Application Laid-Open Nos. H02-247278, H03-255190, H05-202356, H09-202878 and H09-227576.

Furthermore, in addition to organic light-emitting devices using low molecular weight materials as described above, an organic light-emitting device using a conjugated polymer has been reported by a group at Cambridge University (Nature, 347, 539 (1990)). In this report, a film is formed with polyphenylene vinylene (PPV) in a coating system and confirmed light emission from a monolayer. Patents relating to an organic light-emitting device using a conjugated polymer include U.S. Pat. Nos. 5,247,190, 5,514,878, 5,672,678, and Japanese Patent Application Laid-Open Nos. H04-145192 and H05-247460.

In recent years, many studies have been made to utilize energy in a triplet state for electroluminescence by using a phosphorescent compound as the light-emitting material. A high emission efficiency exhibited by an organic light-emitting device using an iridium complex as the light-emitting material has been reported by a group at Princeton University (Nature 395, 151 (1998)). Patents relating to an organic light-emitting device using such a transition element-containing phosphorescent compound include U.S. Pat. Nos. 6,303,238 and 6,579,632.

However, such transition element-containing phosphorescent compounds have low thermal resistance, and therefore possess drawbacks such as susceptibility to thermal decomposition during vacuum deposition when producing an organic light-emitting device, and insufficient durability of the organic light-emitting device. Also, such phosphorescent compounds can only emit phosphorescence. No compounds are known which can simultaneously emit fluorescence and phosphorescence by itself.

SUMMARY OF THE INVENTION

An object of the present invention is to provide a novel organic compound which can simultaneously emit fluorescence and phosphorescence.

Another object of the present invention is to provide a novel organic compound which can emit white light by the simultaneous emission of fluorescence and phosphorescence.

Yet another object of the present invention is to provide an organic light-emitting device which employs a novel organic compound that can simultaneously emit fluorescence and phosphorescence.

Thus, the organic compound according to the present invention consists of elemental hydrogen and at least two kinds of elements selected from the group consisting of elements belonging to the thirteenth group to the seventeenth group of the second period to the fifth period of the periodic table, and can simultaneously emit fluorescence and phosphorescence at a temperature of −30° C. or more and 100° C. or less.

Further, an organic light-emitting device according to the present invention includes at least a pair of electrodes including an anode and a cathode and one or more layers containing an organic compound sandwiched between the pair of electrodes, wherein at least one of the layers containing the organic compound includes at least one of the organic compounds as described above.

According to the present invention, a novel organic compound can be provided which can simultaneously emit fluorescence and phosphorescence.

In addition, by using the organic compound of the present invention as a light-emitting material, it becomes possible to provide an organic light-emitting device which can simultaneously emit fluorescence and phosphorescence, and an organic light-emitting device which can emit white light.

DETAILED DESCRIPTION OF THE PREFERRED EMBODIMENTS

The present invention will now be explained in more detail.

First, the organic compound according to the present invention will be explained.

The organic compound according to the present invention consists of elemental hydrogen and at least two kinds of elements selected from the group consisting of elements belonging to the thirteenth group to the seventeenth group of the second period to the fifth period of the periodic table, and can simultaneously emit fluorescence and phosphorescence at a temperature of −30° C. or more and 100° C. or less.

The organic compound according to the present invention preferably simultaneously emits fluorescence and phosphorescence in a solid state of the organic compound, and also preferably emits white light by the simultaneous emission of fluorescence and phosphorescence.

Specific examples of the organic compound according to the present invention include, for example, compounds represented by the following general formulae [I] to [III]:

[I]

wherein $R_1$ to $R_3$ may be the same as or different from one another, and independently represent a hydrogen atom, a substituted or unsubstituted alkyl group, a substituted or unsubstituted aralkyl group, a substituted or unsubstituted aryl group, a substituted or unsubstituted heterocyclic group, a substituted or unsubstituted fused polycyclic aromatic group, a substituted or unsubstituted fused polycyclic heterocyclic group, a substituted or unsubstituted alkoxy group, a substituted or unsubstituted aryloxy group, a substituted or unsubstituted amine group, or a halogen atom;

[II]

wherein $R_4$ to $R_7$ may be the same as or different from one another, and independently represent a hydrogen atom, a substituted or unsubstituted alkyl group, a substituted or unsubstituted aralkyl group, a substituted or unsubstituted aryl group, a substituted or unsubstituted heterocyclic group, a substituted or unsubstituted fused polycyclic aromatic group, a substituted or unsubstituted fused polycyclic heterocyclic group, a substituted or unsubstituted alkoxy group, a substituted or unsubstituted aryloxy group, a substituted or unsubstituted amine group, or a halogen atom; and

[III]

wherein $R_8$ to $R_{11}$ may be the same as or different from one another, and independently represent a hydrogen atom, a substituted or unsubstituted alkyl group, a substituted or unsubstituted aralkyl group, a substituted or unsubstituted aryl group, a substituted or unsubstituted heterocyclic group, a substituted or unsubstituted fused polycyclic aromatic group, a substituted or unsubstituted fused polycyclic heterocyclic group, a substituted or unsubstituted alkoxy group, a substituted or unsubstituted aryloxy group, a substituted or unsubstituted amine group, or a halogen atom.

Specific examples of $R_1$ to $R_{11}$ in the above general formulae [I] to [III] will be shown below.

Examples of the alkyl group include a methyl group, an ethyl group, an n-propyl group, an isopropyl group, an n-butyl group, a tert-butyl group, an octyl group and the like.

Examples of the aralkyl group include a benzyl group, a phenethyl group and the like.

Examples of the aryl group include a phenyl group, a biphenyl group, a terphenyl group and the like.

Examples of the heterocyclic group include a thienyl group, a pyrrolyl group, a pyridyl group, an oxazolyl group, an oxadiazolyl group, a thiazolyl group, a thiadiazolyl group, a terthienyl group and the like.

Examples of the fused polycyclic aromatic group include a fluorenyl group, a naphthyl group, a fluoranthenyl group, an anthryl group, a phenanthryl group, a pyrenyl group, a tetracenyl group, a pentacenyl group, a triphenylenyl group, a perylenyl group and the like.

Examples of the fused polycyclic heterocyclic group include a carbazolyl group, an acridinyl group, a phenanthrolyl group and the like.

Examples of the alkoxy group include a methoxy group, an ethoxy group, a propoxy group and the like Examples of the aryloxy group include a phenoxy group, a pyridinoxy group, a carbazorylnoxy group and the like.

Examples of the substituted amino group include a dimethylamino group, a diethylamino group, a dibenzylamino group, a diphenylamino group, a ditolylamino group, a dianisolylamino group and the like.

Examples of the halogen atom include fluorine, chlorine, bromine, iodine and the like.

When any of $R_1$ to $R_{11}$ is a substituent and the substituent further has a substituent, such a substituent may be an alkyl group such as a methyl group, an ethyl group, and a propyl group; an aralkyl group such as a benzyl group and a phenethyl group; an aryl group such as a phenyl group and a biphenyl group; a heterocyclic group such as a thienyl group, a pyrrolyl group, and a pyridyl group; an amino group such as a dimethylamino group, a diethylamino group, a dibenzylamino group, a diphenylamino group, a ditolylamino group, and a dianisolylamino group; an alkoxy group such as a methoxy group, an ethoxy group, and a propoxy group; an aryloxy group such as a phenoxy group; a halogen atom such as fluorine, chlorine, bromine, and iodine; a cyano group; a nitro group and the like.

Typical examples of the organic compounds represented by the above formulae [I] to [III] will be given below. However, the present invention is not limited thereto.

1

2

3

4

-continued

5

6

7

8

9

-continued

The organic compound according to the present invention can be synthesized by a well-known method and obtained by using, for example, a synthesis method such as the Suzuki coupling method (e.g., Chem. Rev., 1995, 95, 2457-2483 (1995)) using a palladium catalyst, or the Yamamoto method (e.g., Bull. Chem. Soc. Jpn., 51, 2091, (1978)) using a nickel catalyst.

The organic compound according to the present invention is useful as a layer containing an organic compound for an organic light-emitting device, and is particularly useful as a light-emitting layer.

Next, the organic light-emitting device of the present invention will be described in detail.

The organic light-emitting device of the present invention includes at least a pair of electrodes including an anode and a cathode and one or more layers containing an organic compound sandwiched between the pair of electrodes, in which at least one of the layers containing the organic compound, preferably a light-emitting layer, contains the above-described organic compound.

In the organic light-emitting device of the present invention, the organic compound as described above is formed between the anode and the cathode by a vacuum evaporation method or a solution-coating method. The organic layer is formed into a thin film with a thickness of less than 10 μm, preferably 0.5 μm or less, and more preferably from 0.01 to 0.5 μm.

FIGS. 1 to 6 show preferable examples of the organic light-emitting device according to the present invention.

The reference numerals in the drawings will now be explained.

Reference numeral 1 denotes a substrate, reference numeral 2 denotes an anode, reference numeral 3 denotes a light-emitting layer, reference numeral 4 denotes a cathode, reference numeral 5 denotes a hole-transporting layer, reference numeral 6 denotes an electron-transporting layer, reference numeral 7 denotes a hole-injecting layer, and reference numeral 8 denotes a hole/exciton blocking layer.

Figure 1:
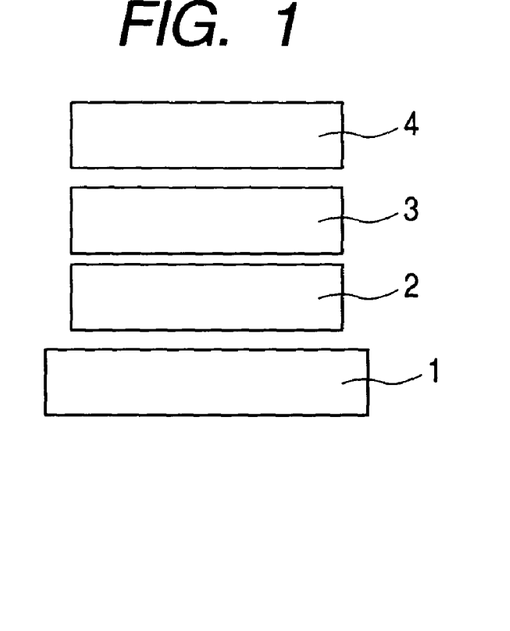
FIG. 1 is a cross-sectional view illustrating one example of an organic light-emitting device according to the present invention.

FIG. 1 is a cross-sectional view showing an example of the organic light-emitting device according to the present invention. In FIG. 1, the device is composed of an anode 2, a light-emitting layer 3, and a cathode 4, which are formed on a substrate 1 in that order. A light-emitting device with this structure is advantageous when a single light-emitting layer itself has performances of hole transport, electron transport and light emission, or when the light-emitting layer is formed by mixing the compounds having respective performances.

Figure 2:
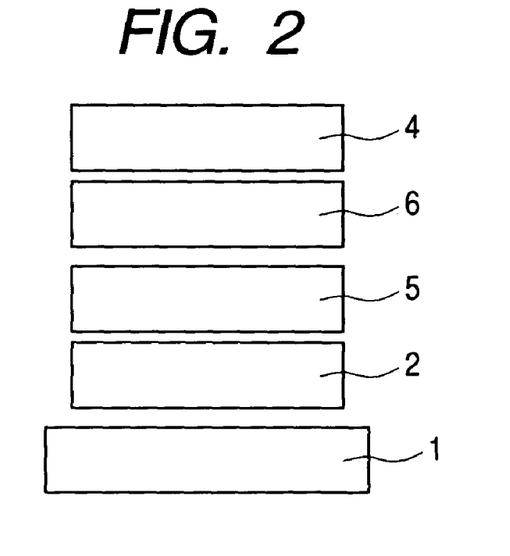
FIG. 2 is a cross-sectional view illustrating another example of an organic light-emitting device according to the present invention.

FIG. 2 is a cross-sectional view showing another example of the organic light-emitting device according to the present invention. In FIG. 2, the device is composed of an anode 2, a hole-transporting layer 5, an electron-transporting layer 6, and a cathode 4, which are formed on a substrate 1 in that order. This device is advantageous when the light-emitting material having either or both of hole transport performance and electron transport performance is used for the respective layers and is combined with hole-transport material or electron-transport material having no light emission performance. In addition, in this case, the luminescent layer consists of either the hole-transporting layer 5 or the electron-transporting layer 6.

Figure 3:
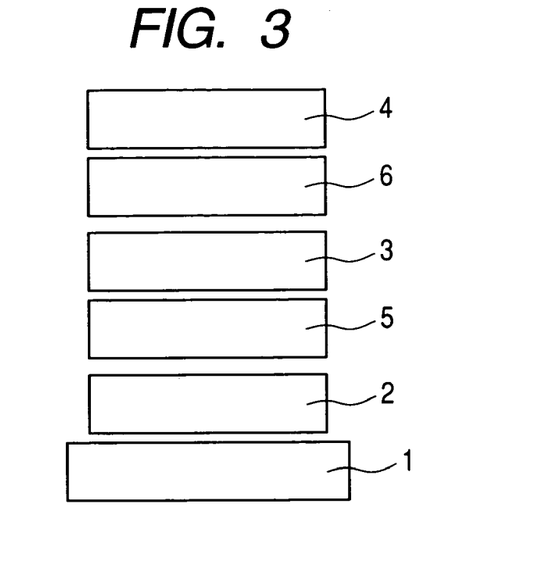
FIG. 3 is a cross-sectional view illustrating another example of an organic light-emitting device according to the present invention.

FIG. 3 is a cross-sectional view showing still another example of the organic light-emitting device according to the present invention. In FIG. 3, the device is composed of an anode 2, a hole-transporting layer 5, a light-emitting layer 3, an electron-transporting layer 6, and a cathode 4, which are formed on a substrate 1 in that order. This device has the carrier transport function and the light emission function which are separated from each other, and is formed by suitably combining compounds having hole transport, electron transport and light emission performances, respectively. Thus, the degree of freedom in selecting materials greatly increases. In addition, various kinds of compounds having different emission wavelengths can be used, thus allowing a variety of emission hues to be achieved. Furthermore, it also becomes possible to increase the emission efficiency by effectively confining each carrier or exciton in the middle light-emitting layer.

Figure 4:
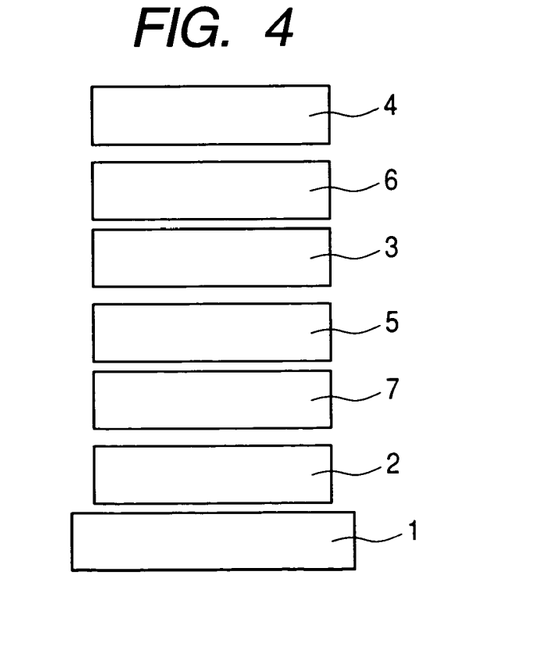
FIG. 4 is a cross-sectional view illustrating another example of an organic light-emitting device according to the present invention.

FIG. 4 is a cross-sectional view showing still another example of the organic light-emitting device according to the present invention. In FIG. 4, as compared with the example of FIG. 3, the device is constructed such that a hole-injecting layer 7 is inserted on the side of the anode 2, which is effective for improving adhesion between the anode 2 and the hole-transporting layer 5 or improving the hole-injecting capability. Thus, this arrangement is effective for lowering voltage.

Figure 5:
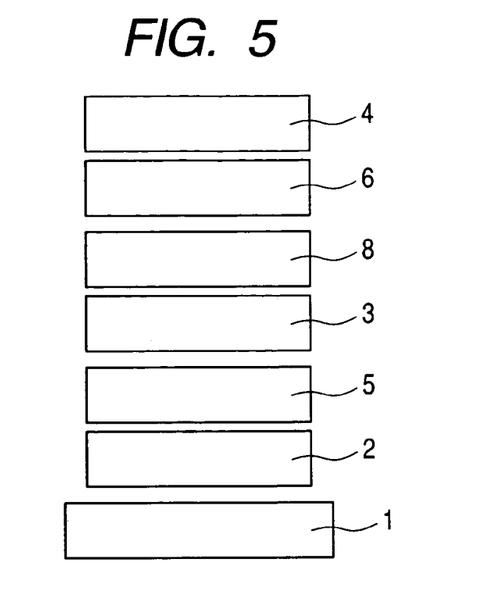
FIG. 5 is a cross-sectional view illustrating another example of an organic light-emitting device according to the present invention.
Figure 6:
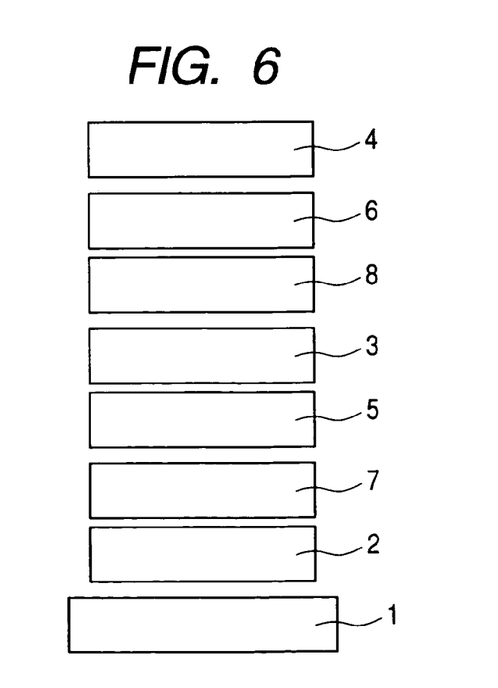
FIG. 6 is a cross-sectional view illustrating another example of an organic light-emitting device according to the present invention.

FIGS. 5 and 6 are cross-sectional views showing other examples of the organic light-emitting device according to the present invention, respectively. In FIGS. 5 and 6, as compared with the examples of FIGS. 3 and 4, each of the devices is constructed such that a layer (hole/exciton blocking layer 8) serving to prevent a hole or an exciton from passing toward the side of the cathode 4 is inserted between the light-emitting layer 3 and the electron-transporting layer 6. The use of a compound having an extremely high ionization potential for the hole/exciton blocking layer 8 is effective for improving emission efficiency.

FIGS. 1 to 6 show basic device structures and do not limit to the structure of the organic light-emitting device using a compound according to the present invention. For example, it is possible to adopt various layer structures, such as one in which an insulating layer is formed at the interface between the electrode and an organic compound layer, one in which an adhesive layer or an interference layer is formed, and one in which the hole-transporting layer is composed of two layers having different ionization potentials.

The organic compound according to the present invention can be used for any of the configurations illustrated in FIGS. 1 to 6.

Although the present invention preferably employs the organic compound according to the present invention as a structural component of the light-emitting layer, the present invention can be used as necessary in conjunction with known hole-transporting compounds, light-emitting compounds, electron-transporting compounds or the like.

Examples of these compounds will now be illustrated.

Hole-transporting Compounds

TPD

α-NPD m-MTDATA

Pc-M
M: Cu, Mg, AlCl, TiO, SiCl$_2$, Zn, Sn, MnCl, GaCl, etc

DTDPFL spiro-TPD

-continued

TPAC

PDA

Electron-transporting Light-emitting Materials

M: Al, Ga

M: Al, Ga

M: Zn, Mg, Be

M: Zn, Mg, Be

-continued

M: Zn, Mg, Be

M: Zn, Mg, Be

M: Zn, Mg, Be

M: Al, Ga

Light-emitting Materials

Coumarin6

DCM-1

Nile red

Quinacridone

DTPABVi

Rubrene          Coronene

Light-emitting Layer Matrix Materials and Electron-transporting Materials

BPhen

-continued

BCP

Polymeric Hole-transporting Materials

Polymeric Light-emitting Materials and Charge-transporting Materials

-continued

In the organic light-emitting device of the present invention, the layer containing the organic compound according to the present invention and the layers containing other organic compounds are generally formed as thin films by a vacuum deposition method, or by a coating method after the organic compounds are dissolved in an appropriate solvent. In particular, in the case of forming a film by a coating method, the film formation may be performed in combination with an appropriate binder resin.

The above binder resin can be selected from a wide variety of binder resins including, for example, polyvinylcarbazole resin, polycarbonate resin, polyester resin, polyarylate resin, polystyrene resin, acrylic resin, methacrylic resin, butyral resin, poly(vinyl acetal) resin, diallyl phthalate resin, phenolic resin, epoxy resin, silicone resin, polysulfone resin, and urea resin, although it is not limited thereto. In addition, one of the above resins may be used singly, or two or more such resins may be combined with each other as a copolymer.

Preferably, an anode material has a work function that is as large as possible. For example, a metal alone, such as gold, platinum, nickel, palladium, cobalt, selenium, or vanadium, or an alloy thereof, or a metal oxide such as tin oxide, zinc oxide, indium tin oxide (ITO), or indium zinc oxide can be used. In addition, a conductive polymer such as polyaniline, polypyrrole, polythiophene, or poly(phenylene sulfide) can also be used. Any one of those electrode materials may be used alone or in combination with a plurality of electrode materials.

On the other hand, preferably, a cathode material may have a small work function. For example, a metal alone, such as lithium, sodium, potassium, cesium, calcium, magnesium, aluminum, indium, silver, lead, tin, or chromium, or an alloy thereof can be used therefor. It is also possible to use a metal oxide such as indium tin oxide (ITO). In addition, the cathode may take either a single-layer structure or a multi-layer structure.

The substrate used in the present invention may be, although not particularly limited, an opaque substrate such as a metallic substrate or a ceramic substrate, or a transparent substrate formed of glass, quartz, plastic sheet, or the like. In addition, it is also possible to control the emission color by using a color filter film, a fluorescent color-converting filter film, a dielectric reflection film or the like on the substrate.

Furthermore, a protective layer or a sealing layer may also be formed on the prepared device for preventing the device from coming into contact with oxygen, moisture, or the like. The protective layer may be a diamond thin film, a film made of an inorganic material such as a metal oxide or a metal nitride, or a polymer film made of fluororesin, polyparaxylene, polyethylene, silicone resin, polystyrene resin or the like. In addition, a photo-curing resin or the like can be used therefor.

Furthermore, it is also possible to package the device itself with an appropriate sealing resin while covering with glass, a gas-impermeable film, a metal or the like.

The present invention will now be described in more detail with reference to the following Examples. However, the present invention is not limited to these Examples.

SYNTHESIS EXAMPLE 1

Synthesis of Exemplified Compound No. 6

No. 6
(37% Yield)

To a solution of 2.0 g (41 mmol) of sodium hydride (50% content) in 30 ml of THF, 6.68 g of carbazole (40 mmol) was gradually added under a nitrogen atmosphere at room temperature. The resulting solution was then stirred for 30 minutes, to thereby prepare a sodium salt of carbazole. This sodium salt of carbazole was added to a solution of 7.32 g (40 mmol) of cyanuric chloride in 50 ml of THF, and the resulting solution was heated to reflux for 5 hours. After the reaction, the reaction solution was added to 500 ml of water. Precipitated yellow crystals (11.5 g) were collected by filtration. These crystals were dissolved by heating with 150 ml of chloroform, and subjected to filtration under heating. The filtrate was cooled to room temperature, and the precipitated white crystals were collected by filtration, to thereby yield 3.3 g (37% yield) of the Example Compound No. 6.

SYNTHESIS EXAMPLE 2

Synthesis of Exemplified Compound No. 1

No. 6

+

-continued

No. 1
(84% Yield)

To a solution of 1.6 g (3.5 mmol) of Exemplified Compound No. 6 in 30 ml of THF, a solution of 0.8 g (3.6 mmol) of 4-iodophenol in 4 ml of 1M sodium hydroxide was gradually added at a room temperature. The resulting solution was then heated to reflux for 8 hours. After the reaction, the reaction solution was added to 200 ml of water. Precipitated white crystals were collected by filtration. These crystals were recrystallized with a chloroform/hexane mixed solvent (1/1, V/V), to thereby yield 1.9 g (84% yield) of the Exemplifed Compound No. 1 (white needle-shaped crystals).

SYNTHESIS EXAMPLE 3

Synthesis of Exemplified Compound No. 11 and Example Compound No. 12

No. 11
(32% Yield)

No. 12
(15% Yield)

To a solution of 1.0 g (20 mmol) of sodium hydride (50% content) in 30 ml of THF, 3.34 g (20 mmol) of carbazole was gradually added under a nitrogen atmosphere at room temperature. The resulting solution was then stirred for 30 minutes, to thereby prepare a sodium salt of carbazole. This sodium salt of carbazole was added to a solution of 2.96 g (20 mmol) of 3,6-dichloropyridazine in 20 ml of THF, and the resulting solution was stirred for 12 hours. After the reaction, the reaction solution was added to 500 ml of water. Precipitated yellow crystals were collected by filtration. These crystals were dissolved by heating in 50 ml of chloroform, and the resulting solution was cooled to room temperature. Precipitated unreacted carbazole was collected by filtration, and the filtrate was purified by isolating with silica gel chromatography (developed using chloroform/hexane (1/1, V/V)), to thereby yield 1.31 g (32% yield) of the Exemplified Compound No. 11 (white crystals) and 0.90 g (15% yield) of the Exemplified Compound No. 12 (white crystals).

EXAMPLE 1

Exemplied Compound No. 1 was measured for its fluorescence spectrum and phosphorescence spectrum in a solid state at room temperature (25° C.) using a Hitachi F-4500 type measuring apparatus.

Figure 7:
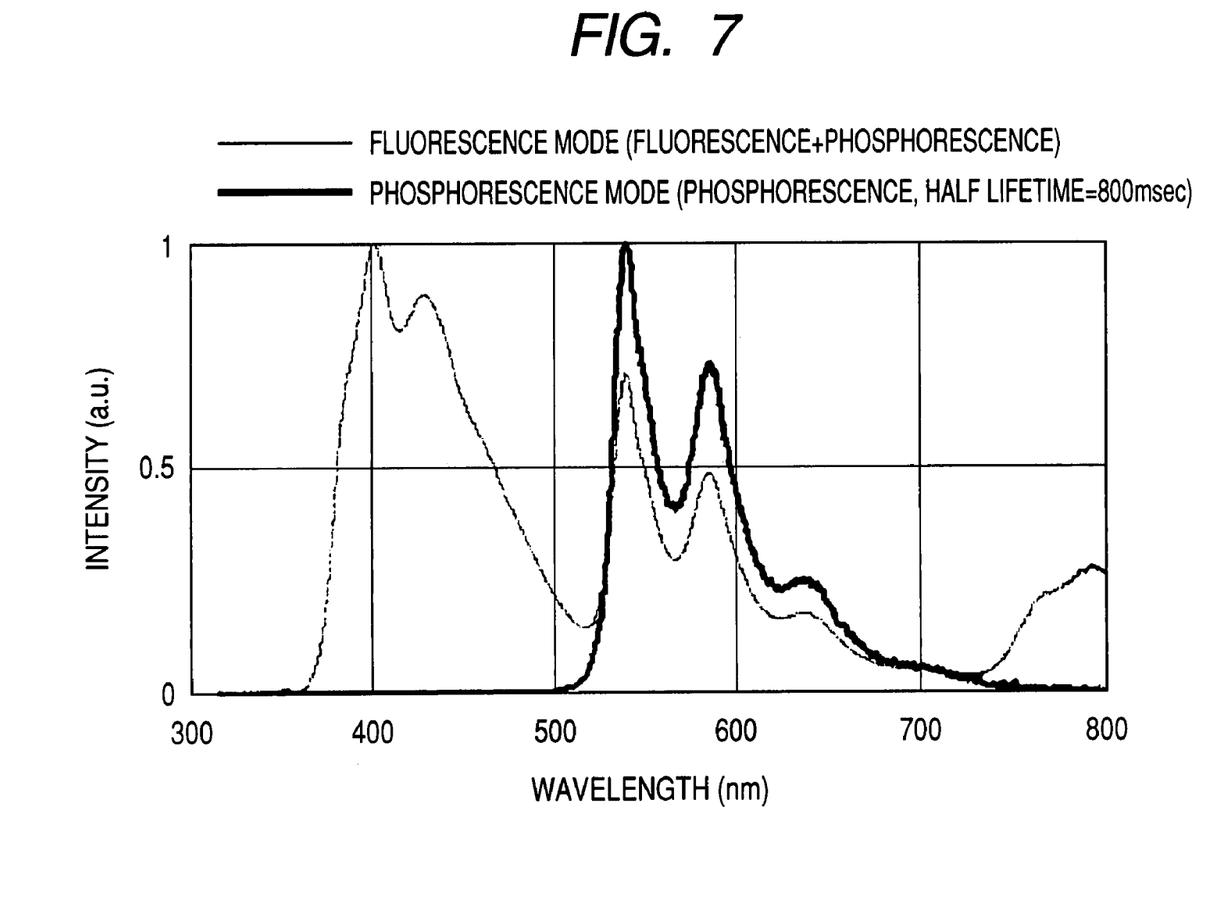
FIG. 7 is a graph showing the fluorescence+phosphorescence spectrum and the phosphorescence spectrum of Exemplified Compound No. 1.

In the fluorescence measurement mode, fluorescence having peaks at 400 nm and 430 nm and phosphorescence having peaks at 535 nm and 585 nm were simultaneously observed. The color of the emitted light of fluorescence+phosphorescence during this fluorescent measurement mode was white. In the phosphorescence measurement mode, only phosphorescence having peaks at 535 nm and 585 nm was observed. These fluorescence+phosphorescence spectrum and phosphorescence spectrum are shown in FIG. 7.

In addition, measurement of the phosphorescence half-life in the phosphorescence measurement mode showed a half lifetime of 800 msec.

EXAMPLES 2 TO 14

Using Exemplified Compounds 2 to 14 in place of Exemplified Compound 1, measurements were carried out in the same manner as that in Example 1. The results are shown in Table 1.

TABLE 1

| | | Fluorescence measurement mode | | Phosphorescence measurement mode | |
| --- | --- | --- | --- | --- | --- |
| Example No. | Exemplified compound No. | Fluorescence emission peak (nm) | Phosphorescence emission peak (nm) | Phosphorescence emission peak (nm) | Phosphorescence half lifetime (msec) |
| 1 | 1 | 400/430 | 535/585 | 535/585 | 800 |
| 2 | 2 | 380/400 | 540/585 | 540/585 | 680 |

TABLE 1-continued

| | | Fluorescence measurement mode | | Phosphorescence measurement mode | |
|---|---|---|---|---|---|
| Example No. | Exemplified compound No. | Fluorescence emission peak (nm) | Phosphorescence emission peak (nm) | Phosphorescence emission peak (nm) | Phosphorescence half lifetime (msec) |
| 3 | 3 | 400 | 550/595 | 550/595 | 650 |
| 4 | 4 | 385/400 | 540/585 | 540/585 | 690 |
| 5 | 5 | 480 | 550/590 | 550/590 | 800 |
| 6 | 6 | 465 | 550 | 550 | 850 |
| 7 | 7 | 420 | 550/595 | 550/595 | 800 |
| 8 | 8 | 385 | 506/540 | 506/540 | 800 |
| 9 | 9 | 437 | 545/580 | 545/580 | 850 |
| 10 | 10 | 413 | 541 | 541 | 800 |
| 11 | 11 | 455 | 545 | 545 | 530 |
| 12 | 12 | 450 | 550 | 550 | 800 |
| 13 | 13 | 420 | 540/580 | 540/580 | 800 |
| 14 | 14 | 420 | 545/580 | 545/580 | 1010 |

It was found from the results shown in Table 1 that fluorescence and phosphorescence could be simultaneously observed from the Exemplified Compounds according to the present invention during fluorescence measurement mode. This means that such simultaneous observation of fluorescence and phosphorescence could be observed in the range of between −30° C. or more and 100° C. or less. The result of this temperature range exhibits that an organic light-emitting device employing the organic compound according to the present invention can be adequately used in the temperature range required for an organic light-emitting element in an actual usage environment.

EXAMPLE 15

A light-emitting device having the structure shown in FIG. 3 was prepared.

A transparent conductive support substrate was obtained by sputtering indium tin oxide (ITO) as an anode 2 to form a film with a thickness of 120 nm on a glass substrate as a substrate 1 Subsequently, this substrate was subjected to ultrasonic cleaning in acetone and isopropyl alcohol (IPA) in order. Next, the substrate was boiled and washed with IPA, followed by drying. Furthermore, the substrate was subjected to UV/ozone cleaning for use as a transparent conductive supporting substrate.

On the transparent conductive support substrate, a solution of the compound represented by the following structural formula in chloroform was deposited by spin-coating to form a film with a thickness of 30 nm as the hole-transporting layer 5.

Next, the Example Compound No. 1 was vacuum-deposited to form a film with a thickness of 50 nm as the light-emitting layer 3. Formation was conducted under conditions in which the degree of vacuum at the time of deposition was $1.0 \times 10^{-4}$ Pa and the film formation rate was 0.2 to 0.3 nm/sec.

Bathophenanthroline was then vacuum-deposited to form a film with a thickness of 40 nm as the electron-transporting layer 6. Formation was conducted under conditions in which the degree of vacuum at the time of deposition was $1.0 \times 10^{-4}$ Pa and the film formation rate was 0.2 to 0.3 nm/sec.

Next, as the cathode 4, lithium fluoride was vacuum-deposited onto the organic layer to form a film with a thickness of 0.5 nm and aluminum was vacuum-deposited thereon to form an aluminum layer with a thickness of 120 nm. Formation was conducted under conditions in which the degree of vacuum at the time of deposition was $1.0 \times 10^{-4}$ Pa and the film formation rate was 1.0 to 1.2 nm/sec.

The resulting structure was then covered with a protective glass plate under a nitrogen atmosphere and sealed with an acrylic resin adhesive.

When a direct current voltage of 17 V was applied onto the obtained by using an ITO electrode (anode 2) as the positive electrode and an Al electrode (cathode 4) as the negative electrode, electric current was caused to flow in the device at a current density of 30 mA/cm² and white luminescence at a luminance of 80 cd/m² was observed.

This application claims priority from Japanese Patent Application No. 2004-260436 filed on Sep. 8, 2004, which is hereby incorporated by reference herein.

What is claimed is:

1. An organic light-emitting device comprising a pair of electrodes including an anode and a cathode and one or more of layers containing an organic compound sandwiched between the pair of electrodes, wherein at least one layer comprises at least one of the organic compounds selected from the group consisting of:

* * * * *